United States Patent [19]

Bayman et al.

[11] Patent Number: 4,468,285
[45] Date of Patent: Aug. 28, 1984

[54] PLASMA ETCH PROCESS FOR SINGLE-CRYSTAL SILICON WITH IMPROVED SELECTIVITY TO SILICON DIOXIDE

[75] Inventors: Atiye Bayman, Palo Alto; Mammen Thomas, San Jose, both of Calif.

[73] Assignee: Advanced Micro Devices, Inc., Sunnyvale, Calif.

[21] Appl. No.: 564,951

[22] Filed: Dec. 22, 1983

[51] Int. Cl.³ .................. H01L 21/306; B44C 1/22; C03C 15/00; C03C 25/06
[52] U.S. Cl. .................. 156/643; 156/646; 156/651; 156/657; 156/659.1; 156/662; 204/192 E; 252/79.1
[58] Field of Search .......... 156/643, 646, 648, 651, 156/657, 659.1, 662; 252/79.1, 79.3, 79.4; 427/38, 39; 204/164, 192 E

[56] References Cited

U.S. PATENT DOCUMENTS 4,069,096  1/1978  Reinberg et al. .......... 252/79.1 X
4,255,230  3/1981  Zajac ........................ 252/79.1 X Primary Examiner—William A. Powell
Attorney, Agent, or Firm—Patrick T. King

[57] ABSTRACT

A plasma etching composition is set forth which comprises chlorine in an amount from about 40% to about 90%, a shape modifier species in an amount from about 10% to about 60%, and an etching selectivity enhancer in an amount sufficient to render the composition at least about 10 times as effective for etching a wafer as for etching a masking layer, the above percents being by mole. The composition is useful for plasma etching of a semiconductor wafer masked with a masking layer having an opening therethrough exposing a portion of the wafer which is to be etched in order to form a depression of a desired depth. This allows depressions of increased depth to be formed in wafers without increasing the thickness of the masking layer.

16 Claims, 4 Drawing Figures

PLASMA ETCH PROCESS FOR SINGLE-CRYSTAL SILICON WITH IMPROVED SELECTIVITY TO SILICON DIOXIDE

DESCRIPTION

BACKGROUND OF THE INVENTION

1. Field of the Invention

This invention relates generally to a gaseous composition useful in plasma etching of semiconductor wafers and the like and to a method of etching semiconductor wafers and the like utilizing the aforesaid composition.

2. Discussion of Background and Prior Art

Plasma etching with directed ions (reactive ion etching) is a well-known technique for making depressions, usually in the nature of slots, in semiconductor wafers and the like. Such slots serve as barriers between adjacent circuit elements providing necessary electrical isolation. The slots are usually filled, for example with amorphous silicon, to provide needed integrity.

Prior to plasma etching of a semiconductor wafer or the like, a masking layer is formed covering the surface of the wafer which is to be etched to a selected depth. Thereafter, a photoresist layer is deposited atop the masking layer. Next, any desired pattern is transferred to the photoresist layer which is then developed to provide a series of troughs in the photoresist layer which expose some portions, but not all, of the masking layer. Thereafter, wet chemical or plasma etching is utilized to eat away the masking layer in the areas of the troughs. This exposes the areas on the surface of the wafer in which it is desired to create depressions or slots.

In carrying out the above process, it is generally desirable to have the masking layer above the wafer be as thin as possible so that any depressions which are to be made in the surface of the wafer are sharply defined by the edges of the masking layer.

Once the needed openings in the masking layer have been formed as described above, the photoresist layer is generally washed away with an appropriate solvent. Thereafter, reactive ion etching is utilized to anisotropically cut desired depressions into the surface of the wafer.

The plasma etch species are directed generally orthogonally towards the surface of the wafer which is being etched. They impinge not only in the depression in the masking layer but also upon the surface of the masking layer. This has an eroding effect upon the masking layer as well as upon the wafer. Generally, the plasma is more selective for etching the wafer than for etching the masking layer, usually by a factor of about five to one. As a result, starting out with a silicon dioxide masking layer of, for example, 1.5 microns thickness, a depression can be formed in the silicon wafer of about 5 microns in depth, while still retaining a silicon dioxide layer of about 0.5 microns at the end of the process. Deeper depressions cannot, however, be formed unless the silicon dioxide layer is made considerably thicker. This, as mentioned above, leads to less delineation of the shape of the depression and is generally undesirable. Yet, in certain instances it is necessary to have relatively deeper depressions than those commonly formed.

Oxygen, in an amount from about 0.5% to about 18%, by mole, has been used along with a majority of a chlorine providing compound, about 5.5% to about 6% silicon tetrachloride or about 25% to about 31% chlorine, in reactive sputter etching of silicon. This process is discussed in the paper "Reactive Sputter Etching of Silicon With Very Low Mask-Material Etch Rates", *IEEE Transactions on Electron Devices,* Vol. ED-28, No. 11, November 1981 by Christopher M. Horwitz. In essence, the process of this reference leads to silicon dioxide deposition on the walls of slots as the slots are being formed. The amount of the oxygen relative to the amount of the chlorine providing compound is high enough so that silicon dioxide is formed and protects the walls from being etched by chlorine. The deposited oxide masking layer is only very slowly attacked because of the redeposition of silicon dioxide which occurs due to the relatively high amount of oxygen present. The argon non-reactively sputters the silicon at the bottom of the slot and the chlorine reacts substantially only at the bottom of the slot. The result is high selectivity for silicon as opposed to silicon dioxide. However, a substantial and undesirable silicon dioxide layer is formed on the walls of the slot. This must later be removed.

SUMMARY OF THE INVENTION

It is an object of the present invention to provide a composition of matter useful in plasma etching and being highly selective for etching silicon as compared to etching silicon dioxide.

Another object of the present invention is to provide a method of forming relatively deep depressions in a silicon wafer masked with a silicon dioxide layer without significantly increasing the thickness of the silicon dioxide layer over that commonly used.

Still another object of the present invention is to provide a relatively high-speed etching process which makes relatively deep depressions in a silicon wafer masked with silicon dioxide while retaining desired shape for the depressions.

Additional objects, advantages and novel features of the invention will be set forth in part in the description which follows, and in part will become apparent to those skilled in the art upon examination of the following or may be learned of by practice of the invention. The objects and advantages of the invention may be realized and obtained by means of instrumentalities and combinations particularly pointed out in the appended claims.

STATEMENT OF THE INVENTION

The above and other objects of the present invention are achieved in accordance with the purposes of the present invention, as embodied and broadly described herein for the use of a plasma etching composition comprising chlorine, a shape modifier species for modifying the shape of depressions formed in a semiconductor wafer and an etching selectivity enhancer which renders the composition at least about ten times as effective for etching the wafer as for etching a masking layer with the components being in particularly required amounts. Such composition is utilized in a plasma etching method wherein it is formed into an ion containing plasma which is directed generally perpendicularly against the surface of the masking layer and of the wafer whereby it passes through an opening in the masking layer and etches the wafer to a selected depth.

In the method of the present invention it is preferred that a pre-etching step be performed under relatively high bias voltage-relatively high energy plasma etching conditions utilizing chlorine and a shape modifier species but excluding the etching selectivity enhancer species. It is further preferred that after the selective plasma etching step of the present invention is carried out, a further etching step be carried out to an additional depth using relatively lower bias voltage-relatively lower energy plasma etching conditions with a plasma which includes chlorine but is substantially free of both the shape modifier species and the etching selectivity enhancer species.

STATEMENT OF DERIVED BENEFITS AND ADVANTAGES

By etching slots into wafers utilizing the composition and method of the present invention, relatively deeper slots can be provided than with prior art plasma etching compositions for the same amount of etching away of the masking layer which covers those portions of the wafer surface which it is not desired to etch.

Utilizing the preferred embodiment of the present invention wherein both a pre-etching step and a post-etching step are utilized, one can control the shape of the slot so that the walls thereof are substantially straight and parallel and can also control the shape of the bottom of the slot so that it does not contain cusps or apexes which would lead to stress points in the wafer after a material such as amorphous silicon had been used to fill the slots.

BRIEF DESCRIPTION OF THE DRAWINGS

The accompanying drawings, which are incorporated in and form a part of the specification, illustrate an embodiment of the present invention, and together with the description, serve to explain the principles of the invention.

In the drawings.

DETAILED DESCRIPTION OF THE INVENTION

Reference will now be made in detail to the preferred embodiment of the present invention, an example of which is illustrated in the accompanying drawings.

Figure 1:
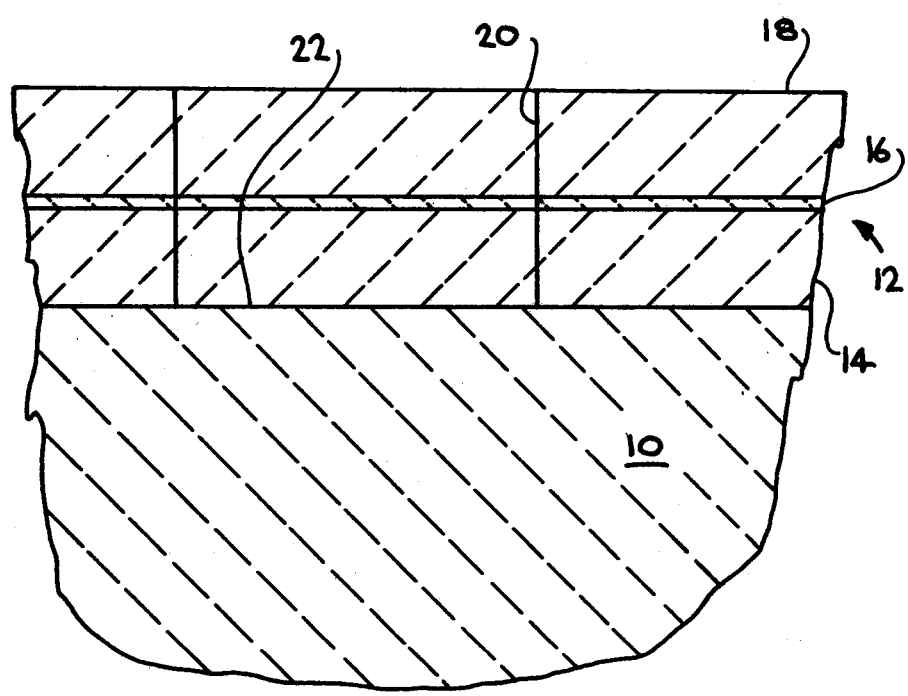
FIG. 1 illustrates, in side section view, a semiconductor wafer having a masking layer thereon having an opening therein prior to any plasma etching of the wafer.

FIG. 1 shows a semiconductor wafer 10 covered by a mask 12 which includes a lower or field oxide layer 14, an intermediate nitride layer 16 and an upper deposited oxide layer 18. The field oxide layer 14 can be conventionally formed by contacting the wafer 10 with oxygen and/or steam at elevated temperatures. The nitride layer 16 and the deposited oxide layer 18 can be sequentially conventionally formed by chemical vapor deposition techniques. The mask 12 includes an opening 20 therethrough exposing a portion 22 of the wafer 10 which is to be etched to form a depression 24 (FIGS. 2-5) of a desired depth.

In accordance with the present invention, a particular plasma etching composition is utilized for directed anisotropic reactive ion etching of the depression 24 into the semiconductor wafer 10. It is this novel plasma etching composition which lies at the heart of the present invention. It is essential that the composition include chlorine in an amount from about 40% to about 90%, preferably from about 50% to about 70%, a shape modifier species in an amount from about 10% to about 60%, preferably about 30% to about 50%, and an etching selectivity enhancer in an amount sufficient to render the composition at least about 10 times as effective for etching the wafer, e.g., silicon, as for etching the masking layer 12, all of the above-mentioned percents being by mole.

The shape modifier species may be any one of a number of different compositions. For example, the shape modifier species may be selected from a group consisting of argon, other noble gases, hydrogen, nitrogen and non-fluoride-containing boron trihalides, silicon tetrahalides, sulfur hexahalides and carbon tetrahalides. The shape modifier species serves for insuring that the walls 26 of the depression 24 are relatively straight and relatively parallel to one another.

The chlorine may be added as chlorine itself. Alternatively, a chlorine producing compound such as boron trichloride, silicon tetrachloride, sulfur hexachloride or carbon tetrachloride, alone, in combination with each other, or in combination with chlorine can serve to provide the chlorine. In the latter instances, the chlorine producing compound can also serve as the shape modifier species.

The etching selectivity enhancer which must be present as part of the composition of the present invention serves for increasing the selectivity of the plasma for etching the the wafer 10, (generally silicon) as opposed to the masking layer 12 (generally silicon dioxide). Generally, the ratio (linear) of the etching of wafer to masking layer is in the ratio of about 5 to 1. This means that the thickness of the deposited oxide layer 18 must be somewhat more than 20% of the desired depth for the depression 24 since for various later steps in the processing of the silicon wafer, it is important that the silicon nitride layer 16 not be eroded by the plasma etching procedure.

In accordance with the present invention, it has been found that oxygen is an effective etching selectivity enhancer. The oxygen may be added as such or a compound which forms oxygen under plasma etch conditions may be used to supply the oxygen. When oxygen is present in a plasma etching composition which also includes a chlorine producing compound and a shape modifier species as set forth above, the ratio of the amount of silicon removed from the depression 24 to the amount of silicon dioxide removed the deposited oxide layer 18 is generally at least about 10 to 1 and is usually about 16 to 1. This permits a much deeper depression 24 to be formed in the wafer 10 for an equal thickness of the deposited oxide layer 18. The oxygen should not be present in an amount sufficient to lead to deposition of silicon dioxide on the walls 26 of the depression 24. Generally, the oxygen should not be present in an amount of more than about 5%, more preferably there is no more than about 3% oxygen, and more preferably still, no more than about 2% oxygen, by mole. It is undesirable to use higher amounts of oxygen, since this can lead to the formation of silicon dioxide on the walls 26 and of stalagmite type peaks in the bottom portion 28 of the depression 24. Indeed, it is generally best to keep the amount of oxygen as low as possible while still retaining the needed amount of selectivity for etching the wafer 10 as opposed to etching of the masking layer 12.

The plasma etching composition of the present invention can be utilized in a single step for providing a depression 24 in a wafer 10 to a desired depth. However, if this is carried out, it has been noted that the bottom 28 of the depression 24 may then contain some stalagmite-like peaks. This can be minimized by using relatively low amounts of oxygen as the etching selectivity enhancer.

Figure 2:
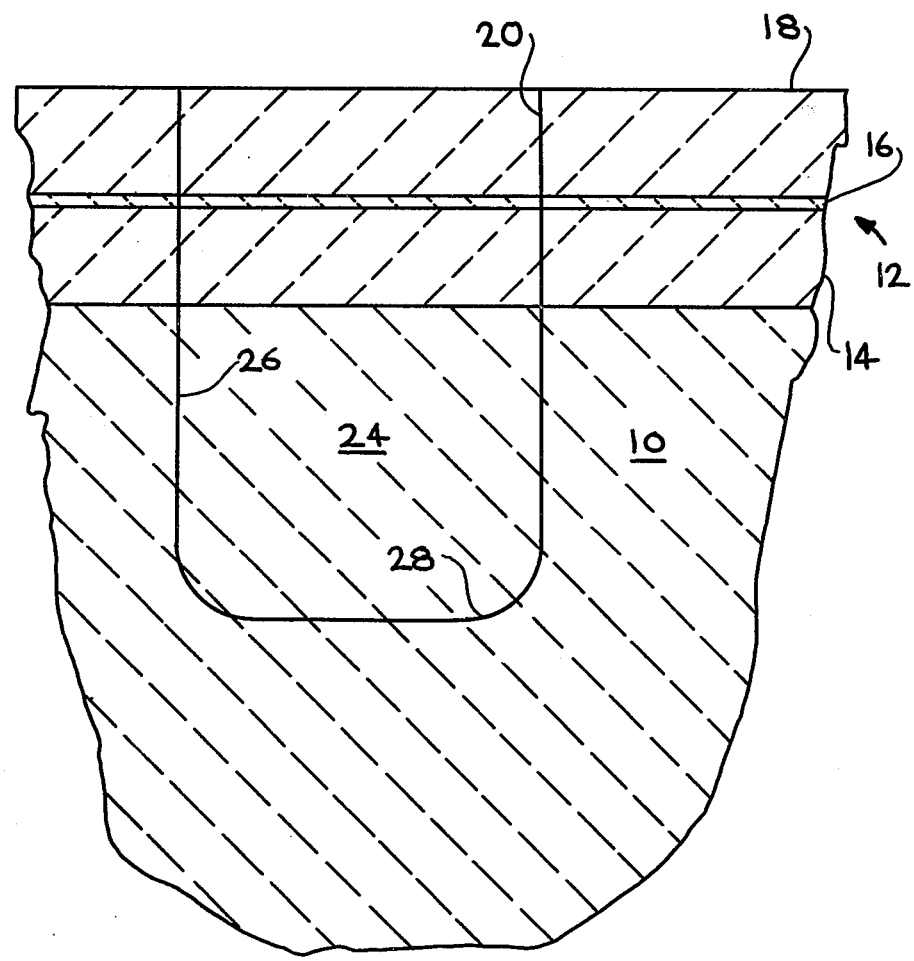
FIG. 2 illustrates, in a view similar to FIG. 1, the masked wafer having a slot therein to a preliminary depth.

In accordance with a preferred embodiment of the present invention, a pre-etching step is carried out to extend depression 24 to a preliminary depth, generally about 30% to 50% of the finally desired depth, as illustrated in FIG. 2. This preliminary step is preferably carried out using relatively high bias voltage-relatively high energy plasma etching conditions with a plasma which includes chlorine and the shape modifier species but which is substantially free of the etching selectivity enhancer. Since no oxygen is present in the pre-etching step, there is no problem with the formation of any stalagmite-type structures in the bottom portion 28 of the depression 24. Since relatively high bias voltage-relatively high energy plasma etching conditions are utilized, the depression 24 can be extended to the preliminary depth in a relatively short period of time.

The terms relatively high bias voltage-relatively high energy and relatively low bias voltage-relatively low energy are used to describe reactive ion etching conditions herein. The term relatively high bias voltage-relatively high energy is used to indicate a bias voltage of at least about 180 volts. The term relatively low bias voltage-relatively low energy is used to indicate a bias voltage of no more than about 180 volts. A Tokuda TRIE-303 parallel plate batch reactor has been used in carrying out the plasma etches described herein. In such an apparatus the wafers 10 sit upon an electrode which has a net negative bias relative to an opposed grounded electrode. Similar results have been obtained with another commercially available batch reactor.

Figure 3:
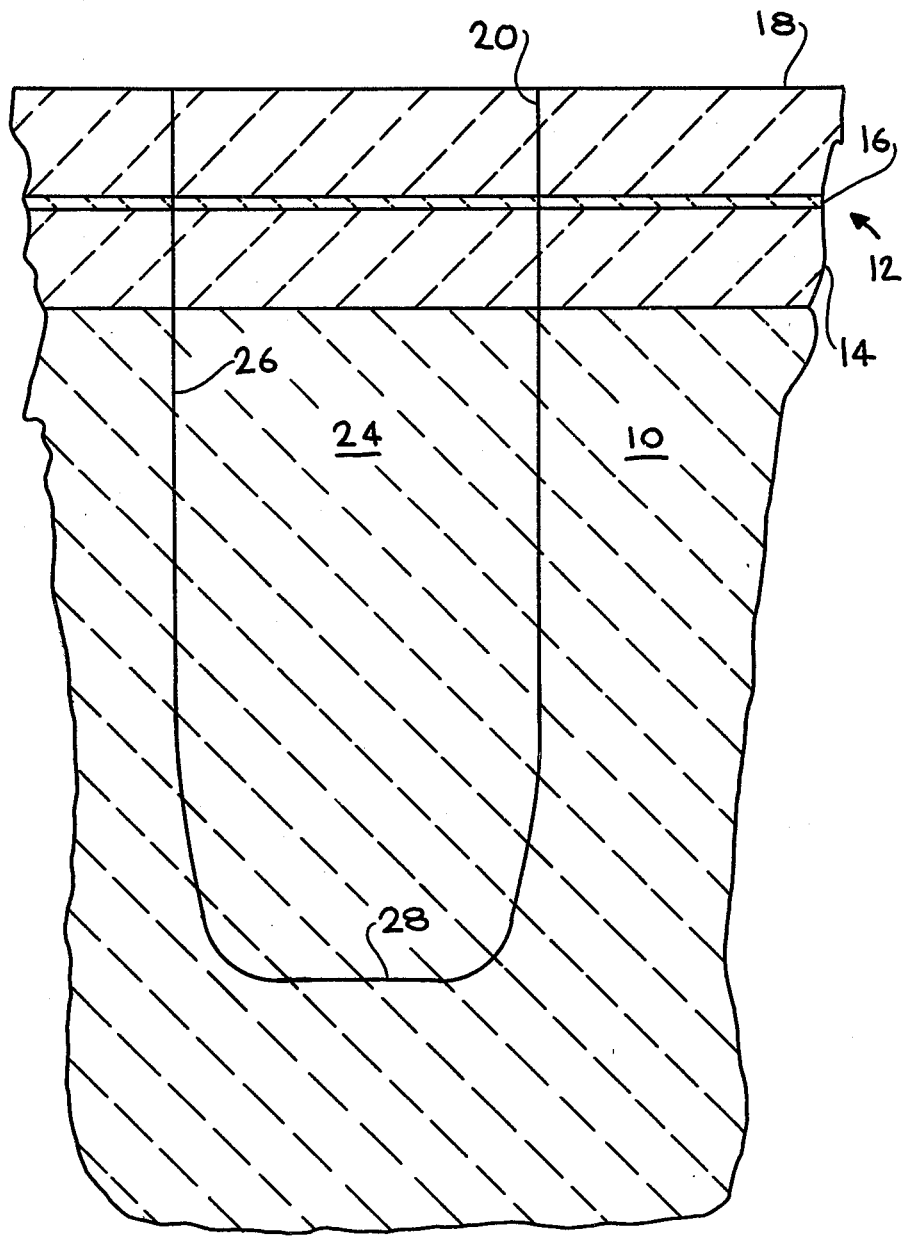
FIG. 3 illustrates, in a view similar to FIGS. 1 and 2, a masked wafer in accordance with the present invention wherein the slot has been increased to a further depth over that of FIG. 2.

FIG. 3 illustrates the situation wherein the depression 24 has been extended from the preliminary depth to a selected depth by selectively plasma etching the depression 24 (FIG. 1) with the plasma etching composition of the present invention, namely with the afore-set-out chlorine, a shape modifier species, and an etching selectivity enhancer. The distance from the preliminary depth to the selected depth is generally from about 30% to about 50% of the finally desired depth. The conditions of the selective plasma etching step can be those of relatively high bias voltage-relatively high energy plasma etching conditions similar to those of the pre-etching step. This allows the step to be carried out in a relatively short period of time.

Because of the high selectivity of the plasma etching composition of the present invention, the deposited oxide layer is etched away to only one-tenth or less of the extent that the wafer 10 is etched away during the etch from the preliminary depth to the selected depth. While a selectivity of 10 to 1 is considered sufficient for the practice of the present invention, selectivities of about 16 to 17 to 1 have been actually measured when the composition of the present invention includes approximately 2% oxygen, approximately 60% chlorine, and approximately 40% argon.

Figure 4:
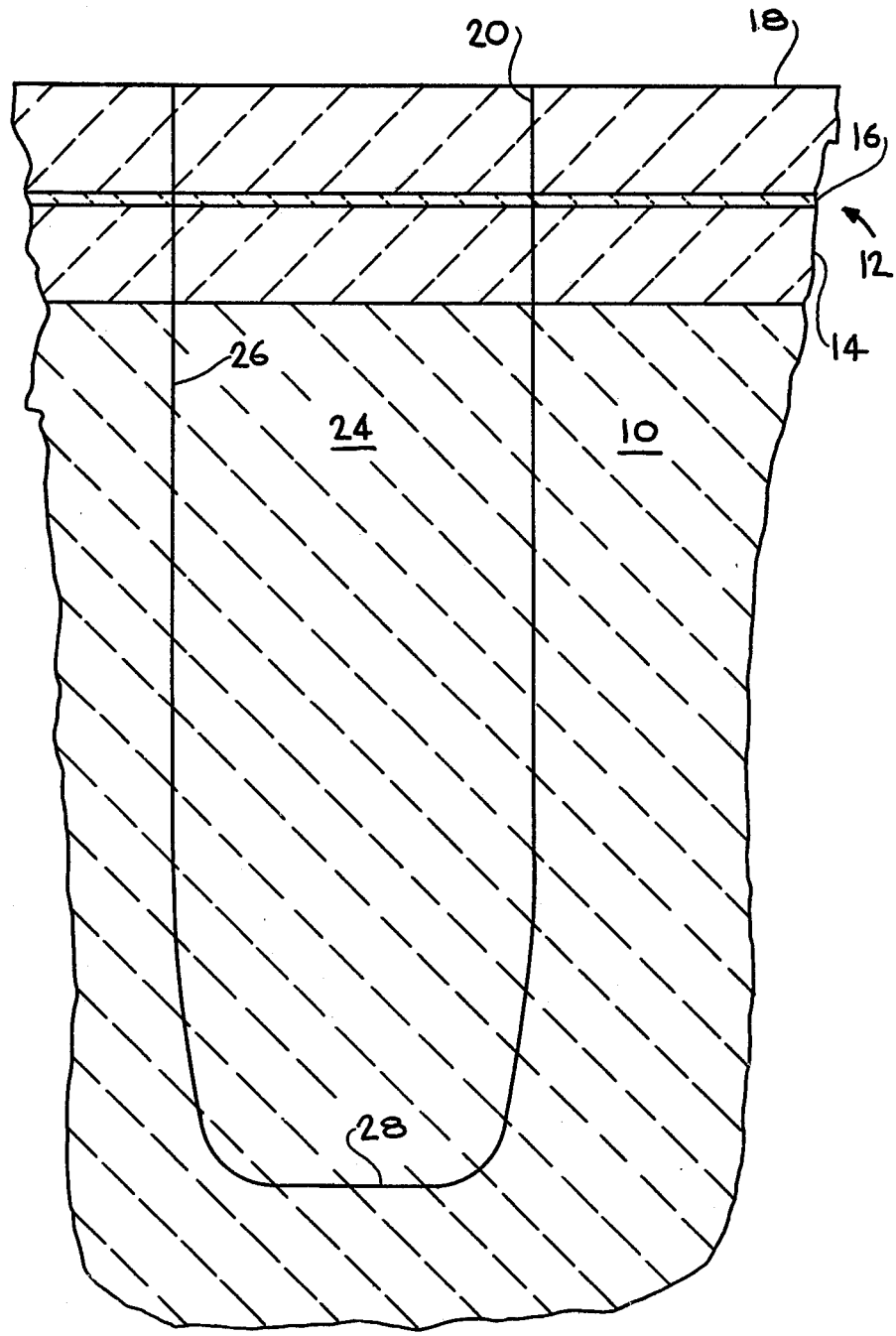
FIG. 4 illustrates, in a view similar to FIGS. 1, 2 and 3, a wafer in accordance with the present invention but wherein the slot has been etched to a total selected depth.

In accordance with the preferred embodiment of the present invention, and as illustrated in FIG. 4, the wafer 10 is next preferably further etched from the selected depth as shown in FIG. 3 to substantially the desired depth as shown in FIG. 4. This is accomplished by carrying out a further etching step wherein the depression 24 is extended to substantially the desired depth as shown in FIG. 4 using relatively low bias voltage-relatively low energy plasma etching conditions with a plasma which includes chlorine (introduced as Cl$_2$) but is substantially free of both the shape modifier species and the etching selectivity enhancer. While this further etching step somewhat slows the overall process since etching is relatively slow under relatively low bias voltage-relatively low energy plasma etching conditions, it results in the bottom portion 28 of the depression 24 being relatively smooth and free of cusps, apexes and other anomalies.

It will be noted that following the pre-etching step, the selective plasma etching step and the further etching step discussed above, it is desirable to wet chemically remove a thin layer, e.g., 250 Angstroms to 750 Angstroms of silicon from the depression 24, since such a layer will generally be damaged by the plasma etching steps. This can be accomplished by adding a wet chemical etching step following the further etching step described above. The wet chemical etching step comprises contacting a wet chemical etching fluid with the depression 24. The wet chemical etching fluid is selected to etch away a desired thickness, e.g., 250 Angstroms to 750 Angstroms, of silicon from the depression 24. Thereafter, the chemical etching fluid is rinsed from the depression 24.

Preferred and useful wet chemical etching fluids comprise generally acidic fluoride-containing solutions. The fluids can further include iodine. Table 1 shows a number of useful wet etching fluids.

TABLE 1

| Wet Chemical Etching Compositions | | | | | | | |
|---|---|---|---|---|---|---|---|
| Composition A | | Composition B | | Composition C | | Composition D | |
| Chemical | Amount | Chemical | Amount | Chemical | Amount | Chemical | Amount |
| CrO$_3$ | 600 gm | I$_2$* | 2.1 gm | HNO$_3$ | 1800 ml | HNO$_3$ | 1800 ml |
| HF | 100 ml | HOAC* | 2100 ml | HOAC | 960 ml | H$_2$O | 960 ml |
| H$_2$O | 2000 ml | HF | 40 ml | NH$_4$F | 110 ml | NH$_4$F | 110 ml |
| | | HNO$_3$ | 5200 ml | | | | |

*Premixed as a solution of I$_2$ in Acetic Acid (HOAC)

The foregoing description of a preferred embodiment of the invention has been presented for the purposes of illustration and description. It is not intended to be exhaustive or to limit the invention to the precise form disclosed, and obviously many modifications and variations are possible in light of the above teaching. The embodiment was chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A plasma etching composition useful in plasma form for etching a semiconductor wafer covered by a masking layer, comprising:
   chlorine in an amount from about 40% to about 90%;
   a shape modifier species in an amount from about 10% to about 60%; and
   an etching selectivity enhancer in an amount sufficient to render the composition at least about 10 times as effective for etching the wafer as for etching the masking layer, said percents being by mole.

2. A plasma composition as set forth in claim 1, wherein said chlorine is produced in the plasma from a compound which forms chlorine under plasma etching conditions.

3. A plasma etching composition as set forth in claim 1, wherein said etching selectivity enhancer comprises oxygen or a compound which forms oxygen under plasma etching conditions in an amount insufficient to cause deposition of silicon dioxide when said composition is used for etching a silicon wafer.

4. A plasma etching composition as set forth in claim 3, wherein the shape modifier species is selected from a group consisting of argon, krypton, xenon, helium, hydrogen, nitrogen, and non-fluoride-containing boron trihalides, silicon tetrahalides, sulfur hexahalides and carbon tetrahalides.

5. A plasma etching composition as set forth in claim 4, wherein said masking layer comprises silicon dioxide.

6. A method of etching a semiconductor wafer masked with a masking layer having an opening therethrough exposing a portion of said wafer which is to be etched to form a depression of a desired depth, comprising:
   selectively plasma etching said portion of said wafer to a selected depth with a plasma comprising chlorine in an amount from about 40% to about 90%; a shape modifier species in an amount from about 10% to about 60%; and an etching selectivity enhancer in an amount sufficient to render the composition at least about ten times as effective for etching the wafer as for etching the masking layer, said percents being by mole, to a selected depth.

7. A method as set forth in claim 6, wherein said chlorine is produced in the plasma from a compound which forms chlorine under plasma etching conditions.

8. A method as set forth in claim 6, wherein said selected depth is less than said desired depth, and further including, following said selective plasma etching step:
   further etching said portion to said desired depth using relatively low bias voltage-relatively low energy plasma etching conditions with a plasma which includes chlorine and is substantially free of said shape modifier species and of said etching selectivity enhancer.

9. A method as set forth in claim 8, further including, prior to said selective plasma etching step:
   pre-etching said portion to a preliminary depth which is less than said selected depth using relatively high bias voltage-relatively high energy plasma etching conditions with a plasma which includes chlorine and said shape modifier species but is substantially free of said etching selectivity enhancer.

10. A method as set forth in claim 6, further including, prior to said selective plasma etching step:
    pre-etching said portion to a preliminary depth which is less than said selected depth using relatively high bias voltage-relatively high energy plasma etching conditions with a plasma which includes chlorine and said shape modifier species but is substantially free of said etching selectivity enhancer.

11. A method as set forth in claim 6, wherein said shape modifier species is selected from the group consisting of argon, krypton, xenon, helium, hydrogen, nitrogen and non-fluoride-containing trihalides, boron trihalides, silicon tetrahalides, sulfur hexahalides and carbon tetrahalides.

12. A method as set forth in claim 11, wherein said etching selectivity enhancer comprises oxygen or a compound which forms oxygen under plasma etching conditions in an amount insufficient to cause deposition of silicon dioxide during said selective plasma etching step.

13. A method as set forth in claim 6, wherein said masking layer comprises silicon dioxide.

14. A method as set forth in claim 6, further including:
    contacting a wet chemical etching fluid with said depression, said fluid being selected to etch away a desired thickness of wafer from said depression, said contacting being for a time sufficient to accomplish etching away of said desired thickness of from said depression; and
    rinsing said chemical etching fluid from said depression.

15. A method as set forth in claim 14, wherein said wet chemical etching fluid comprises an acidic fluoride solution.

16. A method as set forth in claim 15, wherein said wet chemical etching fluid further comprises iodine.

* * * * *